United States Patent
Joshi et al.

(10) Patent No.: US 10,945,333 B1
(45) Date of Patent: Mar. 9, 2021

(54) THERMAL MANAGEMENT ASSEMBLIES HAVING COOLING CHANNELS WITHIN ELECTRICALLY INSULATED POSTS FOR COOLING ELECTRONIC ASSEMBLIES

(71) Applicant: TOYOTA MOTOR ENGINEERING & MANUFACTURING NORTH AMERICA, INC., Plano, TX (US)

(72) Inventors: Shailesh N. Joshi, Ann Arbor, MI (US); Shohei Suenaga, Ann Arbor, MI (US); Yanghe Liu, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 16/692,534

(22) Filed: Nov. 22, 2019

(51) Int. Cl.
*H05K 1/02* (2006.01)
*H05K 1/18* (2006.01)
(Continued)

(52) U.S. Cl.
CPC ......... *H05K 1/0272* (2013.01); *H05K 1/0201* (2013.01); *H05K 1/181* (2013.01);
(Continued)

(58) Field of Classification Search
CPC .. H05K 1/0272; H05K 1/0201; H05K 1/0203; H05K 1/181; H05K 7/20218;
(Continued)

(56) References Cited

U.S. PATENT DOCUMENTS 10,064,302 B2 * 8/2018 Friedlund .............. H05K 7/026
10,149,413 B1 12/2018 Dede et al.
(Continued)

FOREIGN PATENT DOCUMENTS

JP 2013125889 A 6/2013
KR 20030046795 A 6/2003

OTHER PUBLICATIONS

Zhenxian Liang; "Integrated Double Sided Cooling Packaging of Planar SiC Power Modules"; IEEE Energy Conversion; Oct. 29, 2015; 3 pgs. (https://ieeexplore.ieee.org/document/7310352).
(Continued)

*Primary Examiner* — Zachary Pape
*Assistant Examiner* — Amir A Jalali
(74) *Attorney, Agent, or Firm* — Dinsmore & Shohl LLP

(57) ABSTRACT

Thermal management assemblies for cooling an electronic assembly disposed on a PCB are disclosed. The thermal management assembly includes a heatsink, a heatsink manifold formed through the heatsink and a thermal compensation base layer coupled to the heatsink. The heatsink manifold has a fluid inlet and a fluid outlet. The thermal compensation base layer thermally connects the heatsink and the electronic assembly. The thermal management assembly further includes a cooling manifold disposed through the PCB to form a fluid flow path. Two or more electrically insulated posts are disposed between the heatsink manifold and the cooling manifold. Individual electrically insulated posts have a vertical cooling channel. At least one electrically insulated post fluidly connects the fluid inlet to the cooling manifold to form an upward fluid path. At least one electrically insulated post fluidly connects the cooling manifold to the fluid outlet to form a downward fluid path.

20 Claims, 12 Drawing Sheets

(51) Int. Cl.
    *H05K 7/20* (2006.01)
    *H01L 23/473* (2006.01)
(52) U.S. Cl.
    CPC .......... *H01L 23/473* (2013.01); *H05K 1/0203* (2013.01); *H05K 7/20254* (2013.01); *H05K 7/20272* (2013.01); *H05K 7/20927* (2013.01); *H05K 2201/064* (2013.01); *H05K 2201/066* (2013.01); *H05K 2201/10166* (2013.01)
(58) Field of Classification Search
    CPC .......... H05K 7/20254–20272; H05K 7/20872; H05K 2201/064; H05K 2201/066; H05K 2201/10166; H01L 23/34–3775; H01L 23/488
    USPC .......... 361/699, 720; 165/80.4, 104.33, 173; 174/15.1; 257/712–714, E23.098
    See application file for complete search history.

(56) References Cited

U.S. PATENT DOCUMENTS

| | | | |
|---|---|---|---|
| 10,211,068 B2 | 2/2019 | Oi et al. | |
| 2007/0177351 A1* | 8/2007 | Monfarad | H01L 23/473 |
| | | | 361/699 |
| 2007/0177352 A1* | 8/2007 | Monfarad | H01L 23/473 |
| | | | 361/699 |
| 2012/0212907 A1* | 8/2012 | Dede | 361/702 |
| 2012/0300402 A1* | 11/2012 | Vos | H01L 23/427 |
| | | | 361/701 |
| 2013/0255925 A1* | 10/2013 | Knoontz | H01L 23/4332 |
| 2014/0204534 A1* | 7/2014 | Choudhury | G06F 1/206 |
| 2016/0183407 A1* | 6/2016 | Katsumata | H05K 1/0203 |
| | | | 361/699 |
| 2018/0158756 A1* | 6/2018 | Smoot | H01L 21/4871 |
| 2018/0166359 A1* | 6/2018 | Fukuoka | H01L 23/3738 |
| 2019/0078227 A1 | 3/2019 | Joshi et al. | |
| 2019/0206764 A1* | 7/2019 | Kulkarni | H01L 23/3675 |
| 2020/0211927 A1* | 7/2020 | Wan | H01L 23/473 |

OTHER PUBLICATIONS

Justin Broughton, et al.; "Review of Thermal Packaging Technologies for Automotive Power Electronics for Traction Purposes"; https://electronicpackaging.asmedigitalcollection.asme.org/article.aspx?articleid=2688167; Jul. 9, 2019; 15 pgs.

* cited by examiner

THERMAL MANAGEMENT ASSEMBLIES HAVING COOLING CHANNELS WITHIN ELECTRICALLY INSULATED POSTS FOR COOLING ELECTRONIC ASSEMBLIES

TECHNICAL FIELD

The present specification generally relates to cooling structures for electronic assemblies and, more specifically, to thermal management assemblies having cooling channels within electrically insulated posts for cooling electronic assemblies.

BACKGROUND

As electronic assemblies are designed to operate at increased power levels, they generate high heat flux due to the demands of electrical systems. This means that the printed circuit board (PCB) and the active and passive components disposed on the PCB in the electronic assembly should be able to withstand higher temperatures and thermally induced stresses. Conventional heat sinks may be unable to adequately remove sufficient heat to effectively lower the operating temperature of the electronic assemblies to acceptable temperature levels. Further, conventional heat sinks and cooling structures may require additional bonding layers and thermal matching materials (e.g., bond layers, substrates, thermal interface materials). These additional layers and other factors add size and substantial thermal resistance to the overall electronic assemblies and make their thermal management challenging. Accordingly, compact thermal management assemblies integrated with the electronic assemblies are desirable.

SUMMARY

The present specification relates to thermal management assemblies having cooling channels within electrically insulated posts for cooling electronic assemblies. In one embodiment, a thermal management assembly for cooling an electronic assembly disposed on a printed circuit board is disclosed. The thermal management assembly includes a heatsink, a heatsink manifold formed through the heatsink and a thermal compensation base layer coupled to the heatsink. The heatsink manifold has a fluid inlet and a fluid outlet. The thermal compensation base layer is configured to thermally connect the heatsink and the electronic assembly. The thermal management assembly further includes a cooling manifold configured to be disposed through the printed circuit board to form a fluid flow path through the printed circuit board. Two or more electrically insulated posts are disposed between the heatsink manifold and the cooling manifold. An individual electrically insulated post has a vertical cooling channel. At least one electrically insulated post fluidly connects the fluid inlet to the cooling manifold to form an upward fluid path and at least one electrically insulated post fluidly connects the cooling manifold to the fluid outlet to form a downward fluid path.

In another embodiment, an electronic assembly is disclosed. The electronic assembly includes a printed circuit board having a first surface and a second surface opposite to the first surface. One or more switching semiconductor devices are disposed on the first surface. One or more gate drive devices are disposed on the second surface. The electronic assembly also includes a thermal management assembly disposed on the printed circuit board for cooling the electronic assembly. The thermal management assembly includes a heatsink, a heatsink manifold formed through the heatsink and a thermal compensation base layer coupled to the heatsink. The heatsink manifold has a fluid inlet and a fluid outlet. The thermal compensation base layer is configured to thermally connect the heatsink and the electronic assembly. The thermal management assembly further includes a cooling manifold configured to be disposed through the printed circuit board to form a fluid flow path through the printed circuit board. Two or more electrically insulated posts are disposed between the heatsink manifold and the cooling manifold. An individual electrically insulated post has a vertical cooling channel. At least one electrically insulated post fluidly connects the fluid inlet to the cooling manifold to form an upward fluid path and at least one electrically insulated post fluidly connects the cooling manifold to the fluid outlet to form a downward fluid path.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Various embodiments described herein are directed to thermal management assemblies having cooling channels within electrically insulated posts for cooling electronic assemblies. The thermal management assemblies are thermally connected to a printed circuit board (PCB) on which the electronic assemblies comprising active and passive components are disposed. As used herein and well-known in the art, the term "active component" is defined as a component that can electrically control current by means of an electrical signal and introduce energy when placed in an electrical/electronic circuit, while the term "passive component" is defined as a component that cannot electrically control current and hence cannot introduce energy when placed in an electrical/electronic circuit.

Existing thermal management solutions incorporate unifunctional cooling mechanisms that are unable to adequately remove sufficient heat to effectively lower the operating temperature of the electronic assemblies to acceptable temperature levels. The thermal management assemblies described herein are configured to remove heat generated by the switching devices due to higher temperatures and thermally induced stresses during the operation of the electronic assemblies through a thermal compensation base layer and a fluid circuit connecting the heatsink with the PCB. The thermal management assemblies comprise a heatsink and the fluid circuit formed between a fluid inlet and a fluid outlet connecting a heatsink manifold within the heatsink. The fluid circuit comprises channels connecting the heatsink manifold to a cooling manifold disposed through the PCB. The channels are formed through electrically insulated posts and form vertical upward and downward fluid paths between the cooling manifold and the fluid inlet and fluid outlet respectively. Various other aspects of the disclosure and variations thereof are illustrated or implied through the descriptions of the embodiments below.

Figure 1A:
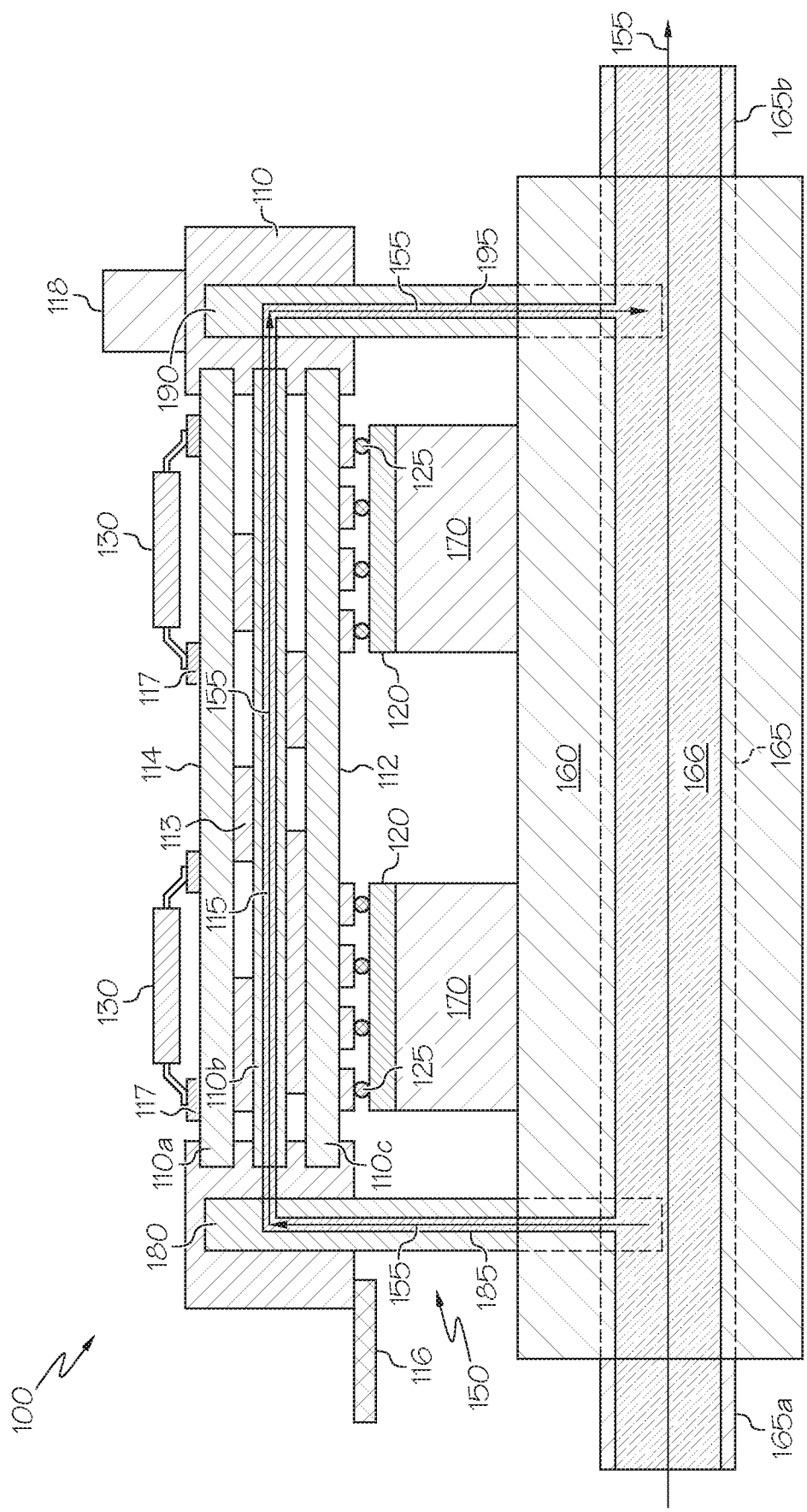
FIG. 1A depicts a lengthwise cross-sectional view of an electronic assembly integrated with a thermal management assembly having a thermal compensation base layer that includes a thermally conductive mount made of a metal or an alloy, according to one or more embodiments shown and described herein.
Figure 1B:
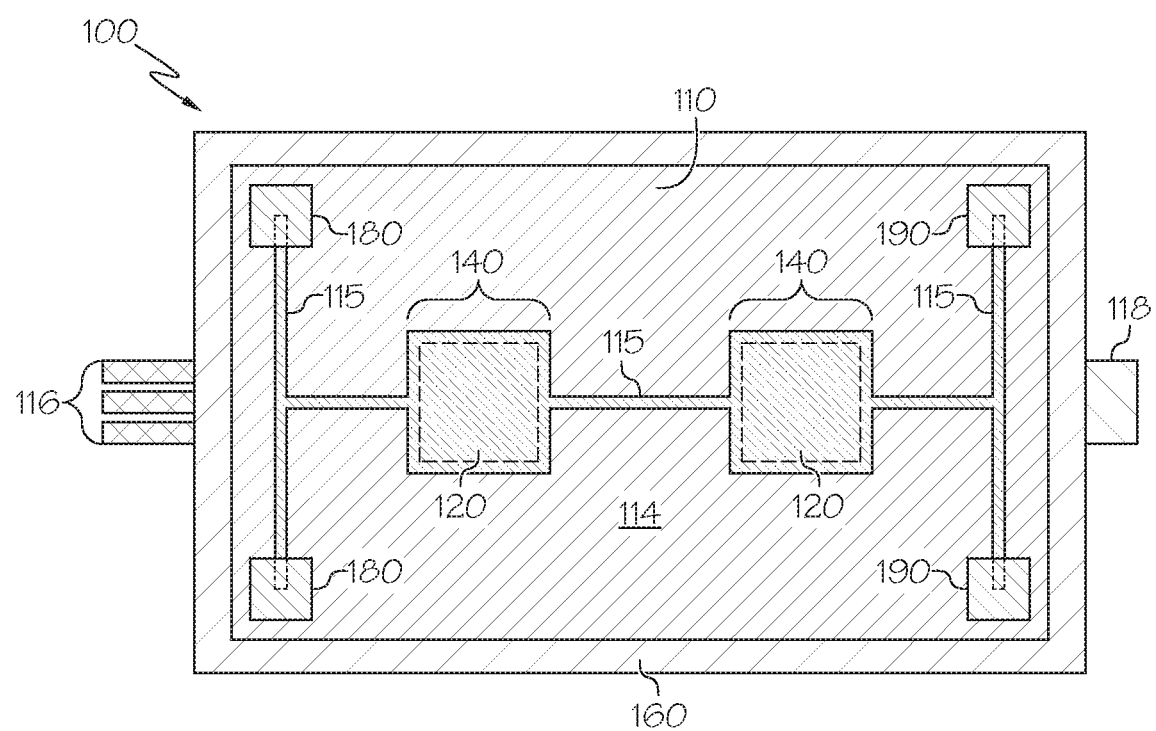
FIG. 1B depicts a top cross-sectional view of the electronic assembly of FIG. 1A, according to one or more embodiments shown and described herein.
Figure 1C:
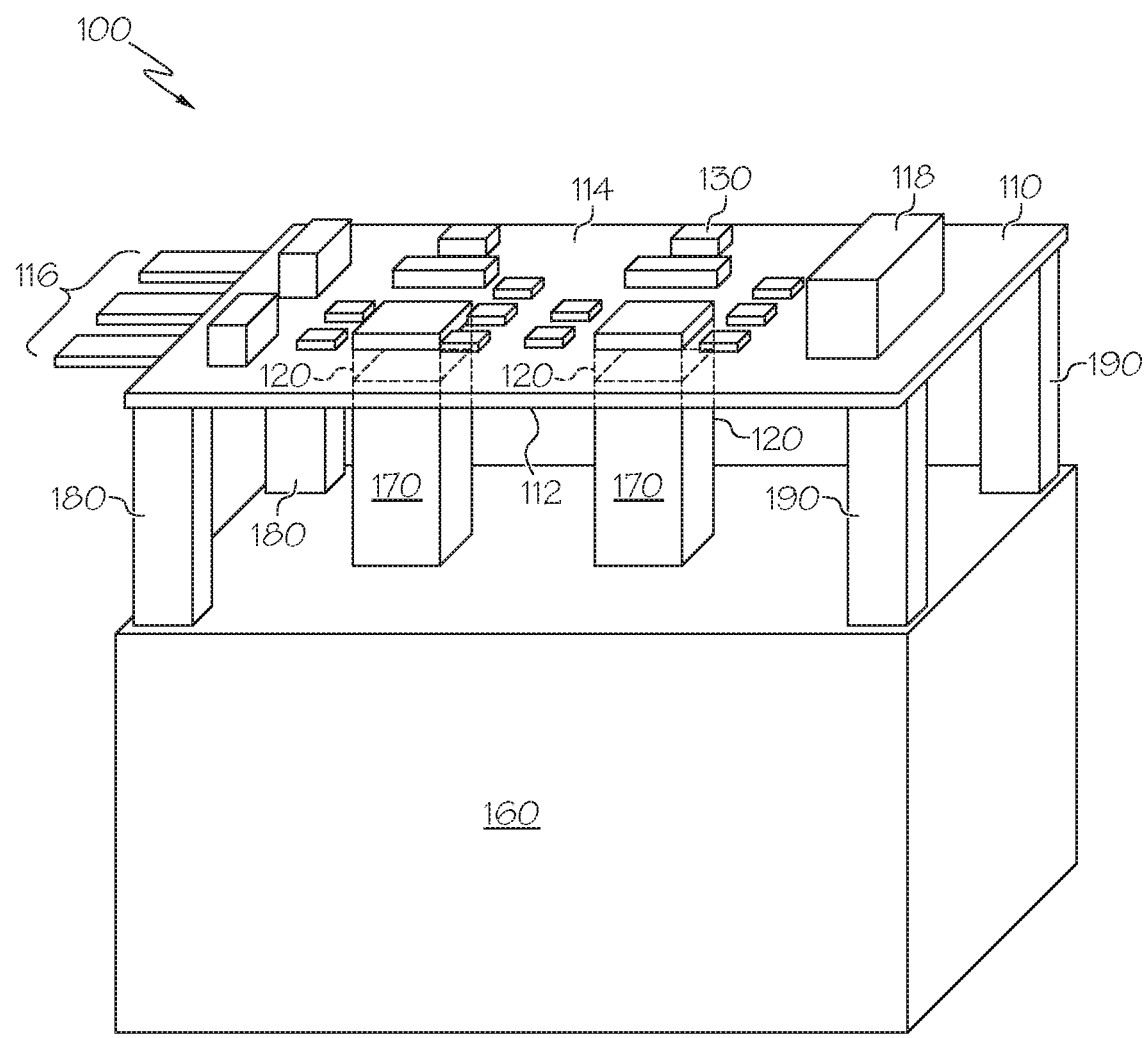
FIG. 1C depicts a perspective view of the electronic assembly of FIG. 1A, according to one or more embodiments shown and described herein.

FIG. 1A depicts a lengthwise cross-sectional view of an example electronic assembly 100 integrated with an example thermal management assembly 150. FIGS. 1B and 1C depict a top cross-sectional view and a perspective view of the example electronic assembly 100 shown in FIG. 1A.

The example electronic assembly 100 includes a multi-layered PCB 110 configured as a substrate on which electronic devices can be disposed. The example PCB 110 shown in FIG. 1A includes three core layers 110*a*, 110*b*, and 110*c* having one or more prepreg layers 113 in between. The PCB has a bottom surface 112 and a top surface 114. In some embodiments, the PCB 110 may be composed of a flame-retardant composite material formed from glass fiber reinforced epoxy resin such as, but not limited to, FR-4. In other embodiments, the PCB 110 may be composed of a ceramic material capable of withstanding temperatures in excess of 250° C. such as, but not limited to, aluminum oxide. In some embodiments, the PCB 110 may have copper patterns on which electronic devices can be bonded. The core layer 110*b* has a cooling manifold 115 disposed therethrough. The cooling manifold 115 is electrically isolated and configured to provide a targeted fluid flow path for absorbing heat from the electronic devices.

One or more switching devices 120 are mounted on the bottom surface 112 of the PCB 110 via a well-known surface-mount packaging technology. The switching devices 120 include one or more active components. In some embodiment shown in FIG. 1A, the switching devices 120 are mounted on the bottom surface 112 using a flip chip ball grid array arrangement comprising a plurality of solder balls 125 made from a high temperature silver or an alloy made of high temperature silver. In other embodiments, the switching devices 120 can be mounted by other means. The switching devices 120 may be one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof (e.g., power cards). In some embodiments, the switching devices 120 may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the switching devices 120 operate at high current and under high temperatures, for example in excess of 250° C. and generate a large amount of heat that must be removed for the continued operation of the electronic assembly 100. A power terminal 116 having positive and negative output is coupled to the bottom surface 112 of the PCB 110.

One or more gate drive devices 130 are bonded to the top surface 114 of the PCB 110 via bonding layers 117. The bonding layer 117 may be a solder layer or a transient liquid phase (TLP) bonding layer. The gate drive devices 130 include one or more active components. The gate drive devices 130 are configured to control the operation of the switching devices 120 and may be coupled to one or more passive components such as, but not limited to, capacitor(s), resistor(s), transformer(s) and inductor(s). A signal connector 118 configured to connect with a signal controller (not shown) is disposed on the top surface 114 of the PCB 110.

The switching devices 120 are thermally coupled (for example, via mechanical connection) to a thermal compensation base layer 170, which is thermally coupled to a heatsink 160 such as, but not limited to, a cold plate. Thus, the thermal compensation base layer 170 thermally connects the switching devices 120 to the heatsink 160. In some embodiments, such as that shown in FIG. 1A, the thermal compensation base layer 170 is a thermally conductive mount made of copper, aluminum, nickel, and/or alloys thereof.

In the example embodiment shown in FIG. 1A, the heatsink 160 has a heatsink manifold 165 formed through the heatsink 160. A cooling fluid flows through the heatsink manifold 165 along a linear direction 166 between a fluid inlet 165*a* and a fluid outlet 165*b* and is configured to absorb and transfer heat generated from the operation of the electronic assembly 100. The cooling fluid may be air, an electrically conductive fluid, such as an ethylene glycol mixture, water, etc. or a dielectric cooling fluid that undergoes single-phase cooling. In some embodiments, the cooling fluid may undergo two-phase cooling by transforming from a liquid phase to a vapor phase.

One or more electrically insulated posts 180 are disposed between the heatsink 160 and the PCB 110 proximate to the fluid inlet 165a. Each of the electrically insulated posts 180 extends through the core layers 110a, 110b, and 110c of the PCB 110. Each electrically insulated post 180 has a vertical cooling channel 185 fabricated therethrough. The vertical cooling channel 185 structurally connects the heatsink manifold 165 with the cooling manifold 115, thus forming an upward fluid path. In the embodiment shown in FIGS. 1A-1C, two electrically insulated posts 180 form two vertical cooling channels 185 that connect the heatsink manifold 165 to the cooling manifold 115. However, in other embodiments, there could be more or less than two electrically insulated posts 180. In some embodiments, the electrically insulated posts 180 are made of poly-silicon or a ceramic material.

Similarly, one or more electrically insulated posts 190 are disposed between the heatsink 160 and the PCB 110 proximate to the fluid outlet 165b. Each of the electrically insulated posts 190 extends through the core layers 110a, 110b, and 110c of the PCB 110. Each electrically insulated post 190 has a vertical cooling channel 195 fabricated therethrough. The vertical cooling channel 195 structurally connects the heatsink manifold 165 with the cooling manifold 115, thus forming a downward fluid path. In the embodiment shown in FIGS. 1A-1C, two electrically insulated posts 190 form two vertical cooling channels 195 that connect the cooling manifold 115 to the heatsink manifold 165. However, in other embodiments, there could be more or less than two electrically insulated posts 190. In some embodiments, the electrically insulated posts 190 are made of poly-silicon or a ceramic material.

The cooling fluid entering the heatsink manifold 165 at the fluid inlet 165a is directed to flow, for example by a pump (not shown), through the upward fluid path within the vertical cooling channels 185 and into the cooling manifold 115. The cooling manifold 115 has one or more heat transfer chambers 140 positioned strategically above and configured to absorb maximum heat flux generated by the one or more switching devices 120. In the embodiment shown in FIGS. 1A-1B, the cooling manifold 115 has two heat transfer chambers 140 positioned above the two switching devices 120 respectively. Upon absorbing the heat generated by the switching devices 120, the cooling fluid flows down through the downward fluid path within the vertical cooling channels 195 and back into the heatsink manifold 165, before it finally exits through the fluid outlet 165b. The flow of the cooling fluid through the upward fluid path in the vertical cooling channels 185, the cooling manifold 115 and the downward fluid path in the vertical cooling channels 195 comprise a fluid circuit 155 between the heatsink manifold 165 and the cooling manifold 115.

The heatsink 160, the heatsink manifold 165, the thermal compensation base layer 170, the cooling manifold 115, and the electrically insulated posts 180, 190 forming the fluid circuit 155 comprise the thermal management assembly 150. Heat is removed through the thermal compensation base layer 170 as well as the cooling fluid flowing through the heatsink manifold 165, the fluid circuit 155, and the cooling manifold 115, as described above. The thermal management assembly 150 is thermally connected to the PCB 110 and thus configured to remove heat from the electronic assembly 100 at high operating temperatures, for example in excess of 250° C.

Figure 2A:
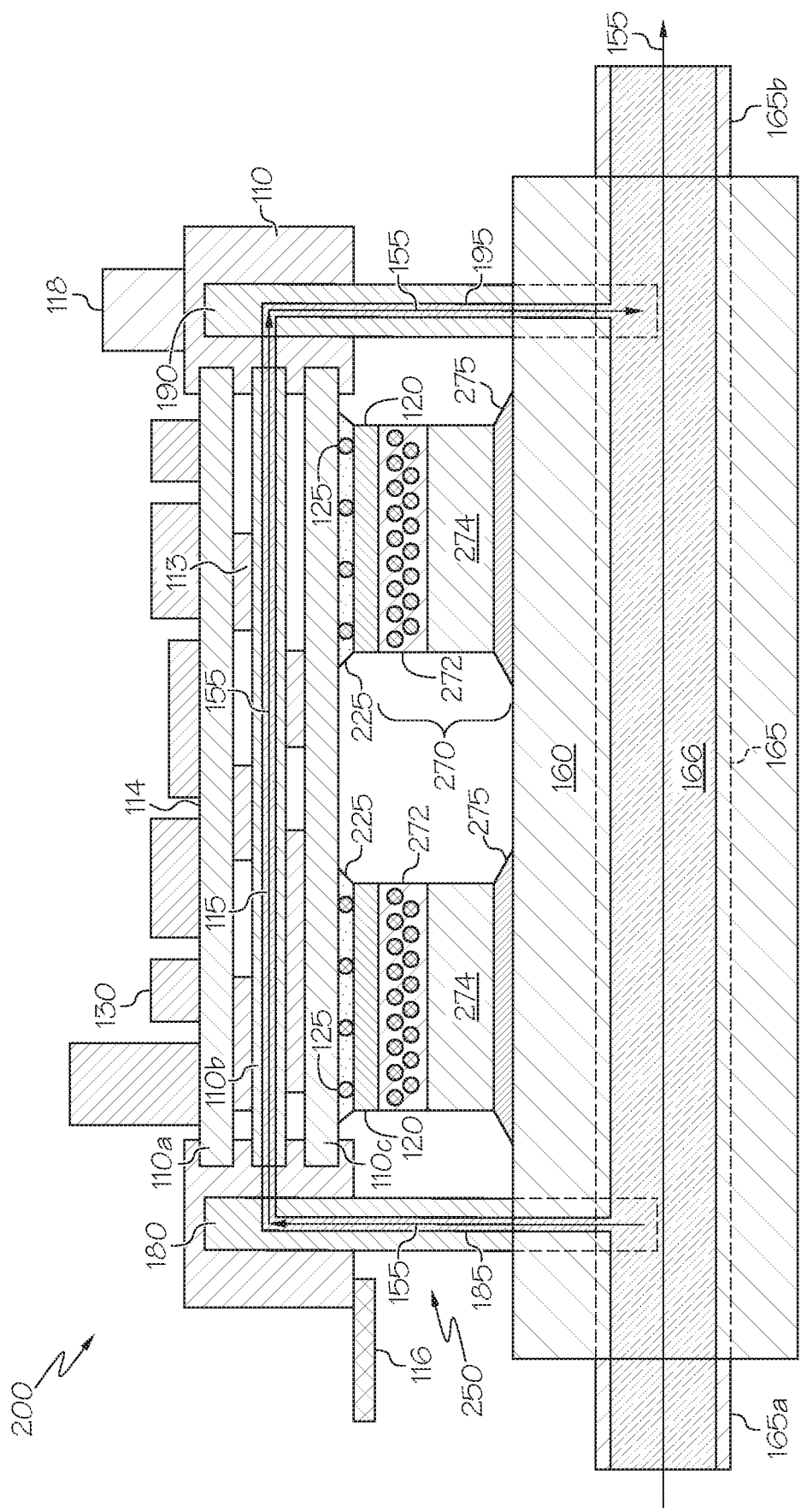
FIG. 2A depicts a lengthwise cross-sectional view of an electronic assembly integrated with a thermal management assembly having a thermal compensation base layer that includes a metal inverse opal (MIO) structure, according to one or more embodiments shown and described herein.
Figure 2B:
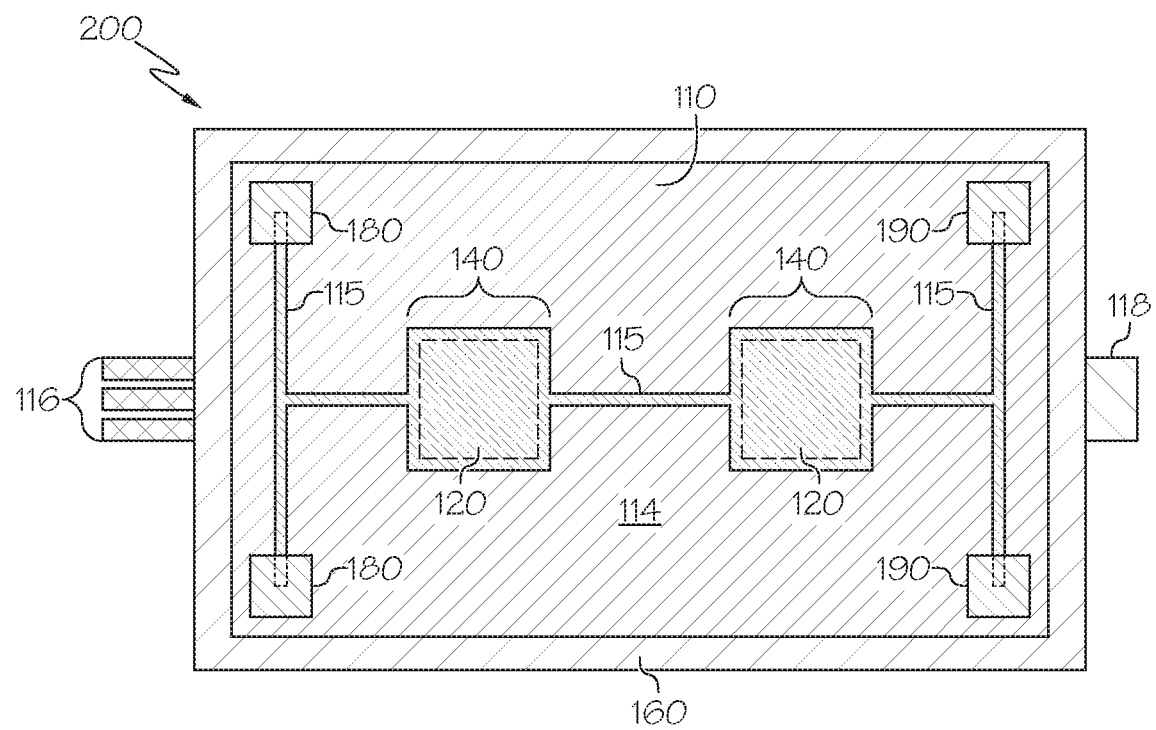
FIG. 2B depicts a top cross-sectional view of the electronic assembly of FIG. 2A, according to one or more embodiments shown and described herein.
Figure 2C:
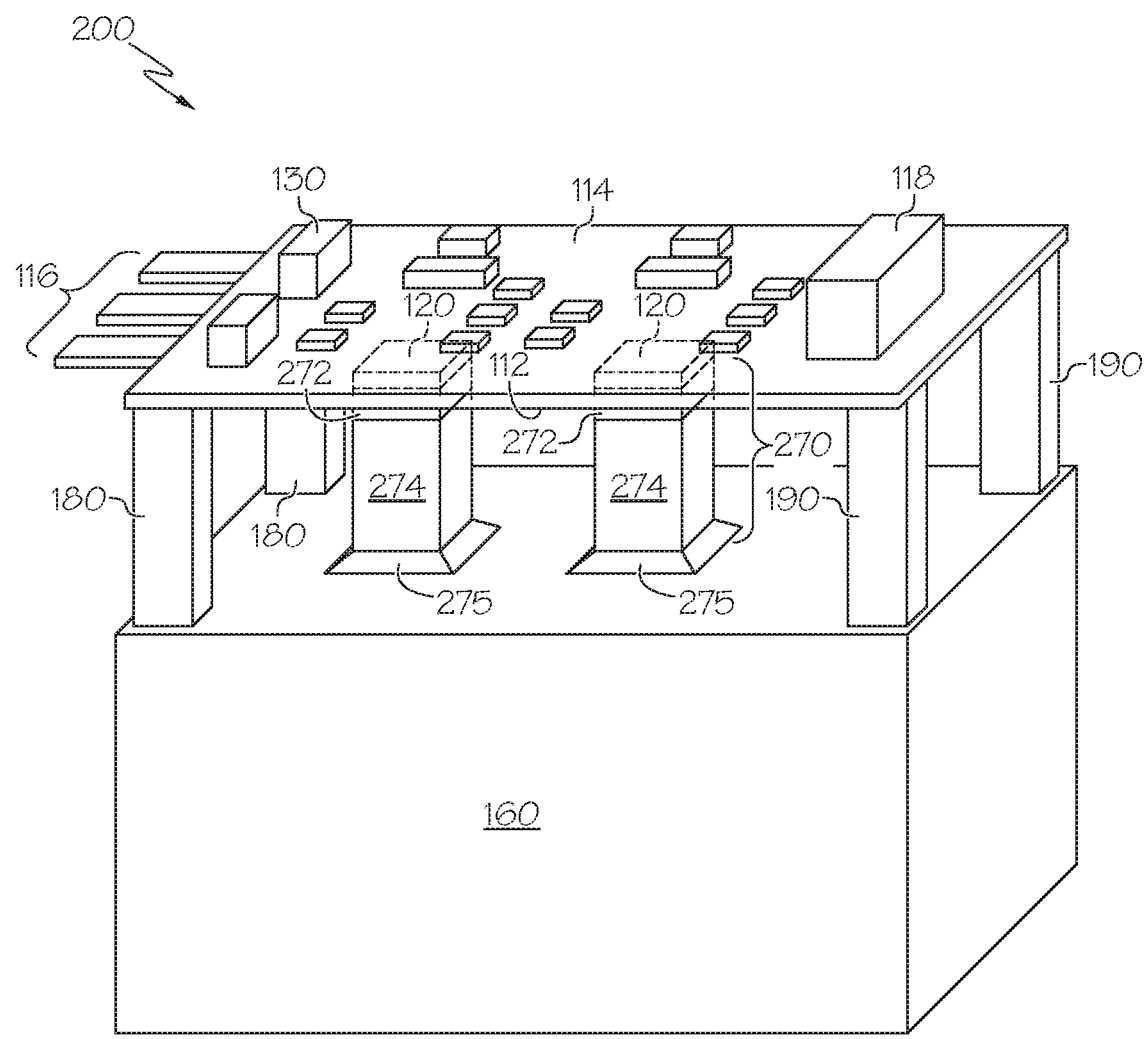
FIG. 2C depicts a perspective view of the electronic assembly of FIG. 2A, according to one or more embodiments shown and described herein.

FIG. 2A depicts a lengthwise cross-sectional view of another example electronic assembly 200 integrated with an example thermal management assembly 250. FIGS. 2B and 2C depict a top cross-sectional view and a perspective view of the example electronic assembly 200 shown in FIG. 2A.

The example electronic assembly 200 includes the multi-layered PCB 110 having the cooling manifold 115 disposed through the core layer 110b, as described above. The cooling manifold 115 is electrically isolated and configured to provide a targeted fluid flow path for absorbing heat from the electronic devices disposed on the PCB 110. One or more switching devices 120 and the power terminal 116 having positive and negative output are mounted on the bottom surface 112 of the PCB 110. In some embodiments, an underfill material 225 may be provided around the plurality of solder balls 125 for enhanced stability of the mounted switching devices 120. One or more gate drive devices 130 are bonded to the top surface 114 of the PCB 110. The signal connector 118 is disposed on the top surface 114 of the PCB 110.

The switching devices 120 are thermally coupled (for example, via mechanical connection) to a thermal compensation base layer 270, which is thermally coupled to the heatsink 160. Thus, the thermal compensation base layer 270 thermally connects the switching devices 120 to the heatsink 160. In some embodiments, such as that shown in FIG. 2A, the thermal compensation base layer 270 includes a metal inverse opal (MIO) structure 272, a cap layer 274 overgrown on the MIO structure 272, and an electrically insulating layer 275 disposed between the cap layer 274 and the heatsink 160. In some embodiments, the electrically insulating layer 275 may be a metal oxide such as, but not limited to, copper oxide.

The MIO structure 272 includes any inverse opal structure, such as, for example, a copper inverse opal (CIO) structure, a nickel inverse opal (NIO) structure, or other inverse opal structure made from aluminum, silver, zinc, magnesium, or alloys thereof. The MIO structure 272 is an integrated metal porous structure that provides a combination of large surface-to-volume ratio, high conductivity, and mechanical compliance and thus can improve heat dissipation from the electronic assembly 200. The MIO structure 272 can also provide thermal stress relief due to mismatch in the coefficient of thermal expansion (CTE) with the components of the electronic assembly 200. The cap layer 274 is formed by further deposition of the corresponding metal of the MIO structure 272, i.e. copper, nickel, etc. over the inverse opal structure of MIO structure 272.

In the example embodiment shown in FIG. 2A, the heatsink 160, the heatsink manifold 165, the thermal compensation base layer 270, the cooling manifold 115, and the electrically insulated posts 180, 190 forming the fluid circuit 155 comprise the thermal management assembly 250, which operates substantially similar to the thermal management assembly 150 depicted by FIGS. 1A-1C. Heat is removed through the thermal compensation base layer 270 as well as a cooling fluid flowing through the heatsink manifold 165, the fluid circuit 155, and the cooling manifold 115, as described above. The thermal management assembly 250 is thermally connected to the PCB 110 and thus configured to remove heat from the electronic assembly 200 at high operating temperatures, for example in excess of 250° C.

Figure 3A:
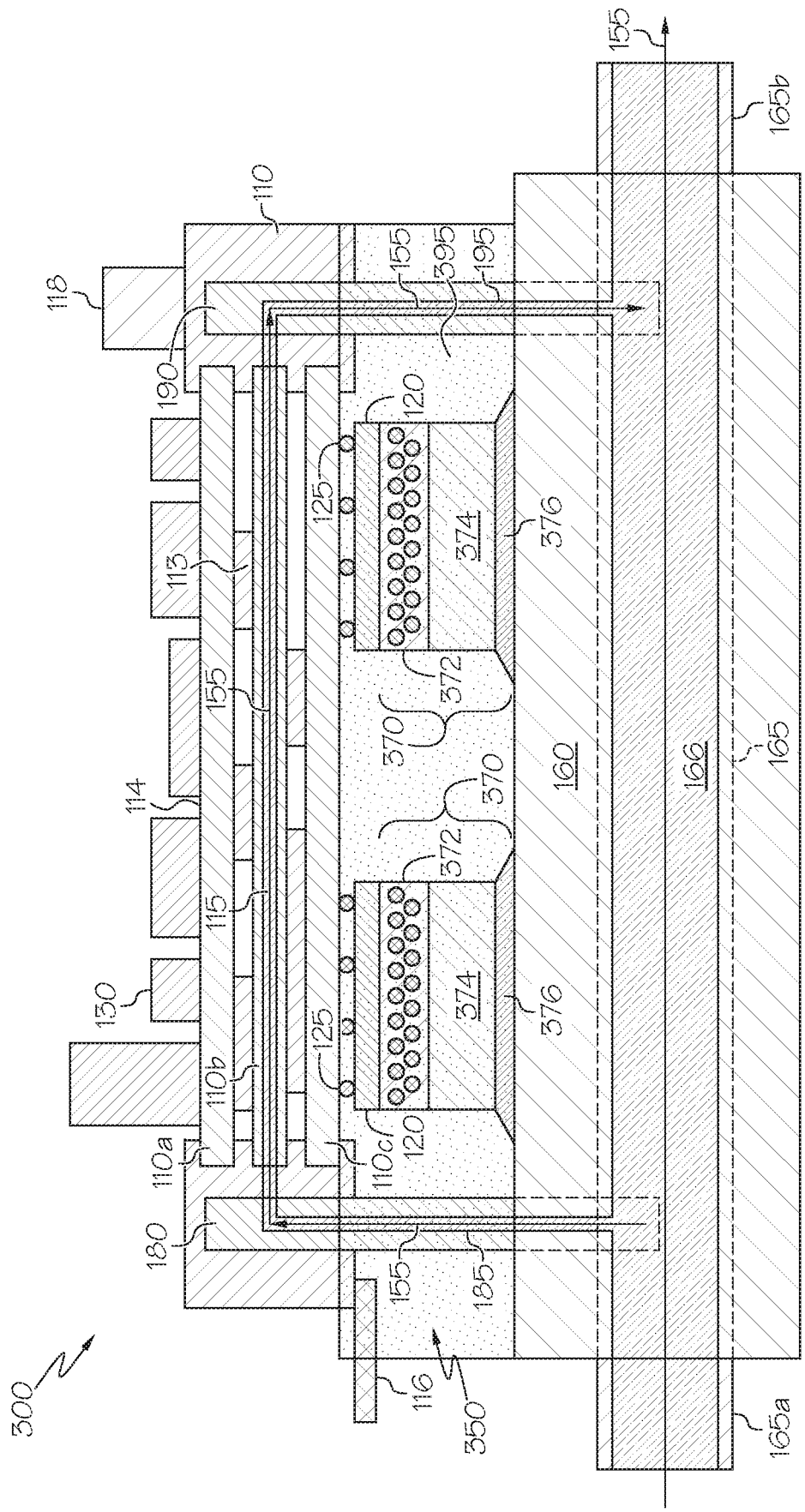
FIG. 3A depicts a lengthwise cross-sectional view of an electronic assembly integrated with a thermal management assembly and having a mold layer disposed between a heatsink of the thermal management assembly and the PCB of the electronic assembly, according to one or more embodiments shown and described herein.
Figure 3B:
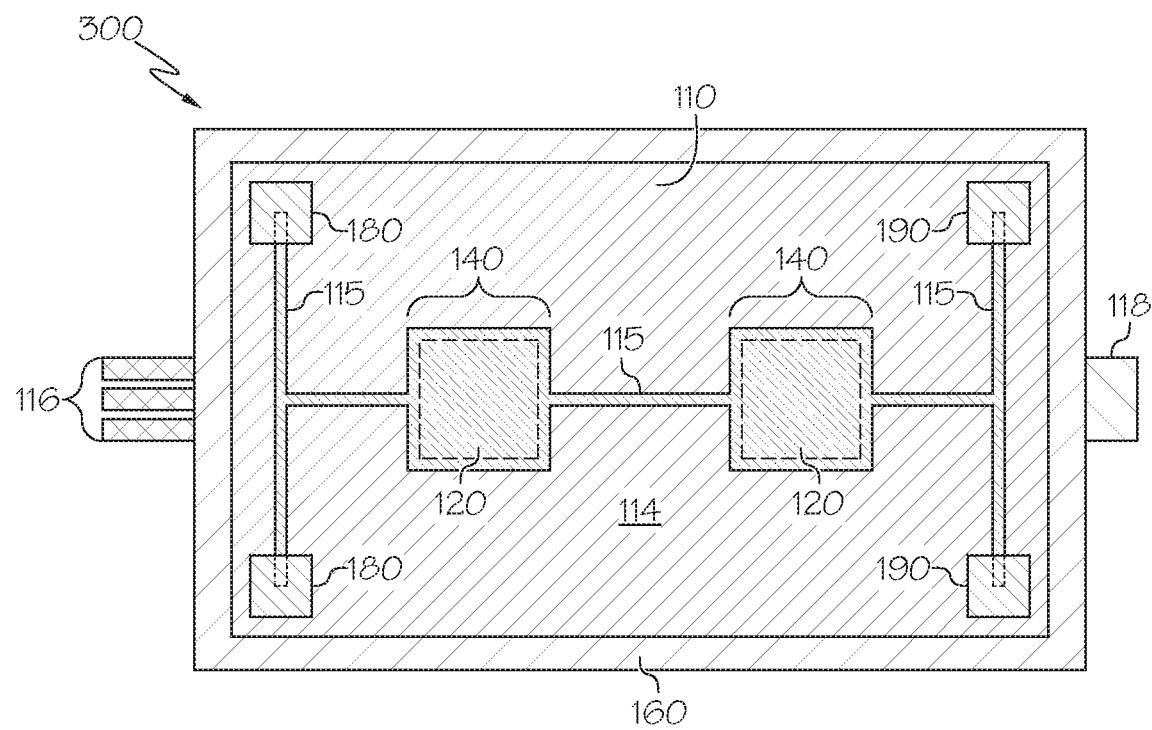
FIG. 3B depicts a top cross-sectional view of the electronic assembly of FIG. 3A, according to one or more embodiments shown and described herein.
Figure 3C:
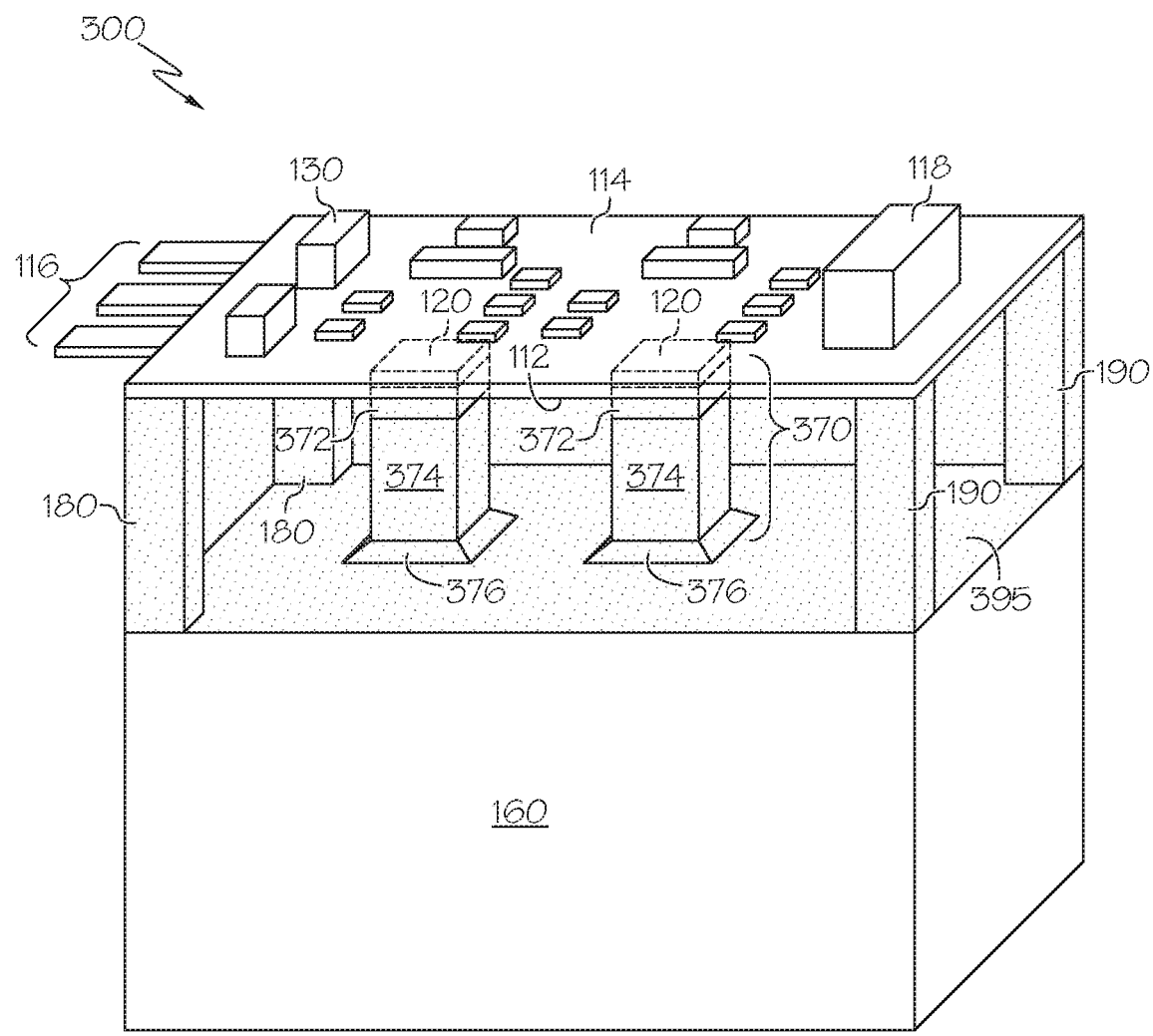
FIG. 3C depicts a perspective view of the electronic assembly of FIG. 3A, according to one or more embodiments shown and described herein.

FIG. 3A depicts a lengthwise cross-sectional view of another example electronic assembly 300 integrated with an example thermal management assembly 350. FIGS. 3B and 3C depict a top cross-sectional view and a perspective view of the example electronic assembly 300 shown in FIG. 3A.

The example electronic assembly 300 includes the multi-layered PCB 110 having the cooling manifold 115 disposed through the core layer 110b, as described above. The cooling manifold 115 is electrically isolated and configured to provide a targeted fluid flow path for absorbing heat from the electronic devices disposed on the PCB 110. One or more switching devices 120 and the power terminal 116 having positive and negative output are mounted on the bottom surface 112 of the PCB 110. One or more gate drive devices 130 are bonded to the top surface 114 of the PCB 110. The signal connector 118 is disposed on the top surface 114 of the PCB 110.

The switching devices 120 are thermally coupled (for example, via mechanical connection) to a thermal compensation base layer 370, which is thermally coupled to the heatsink 160. Thus, the thermal compensation base layer 370 thermally connects the switching devices 120 to the heatsink 160. In some embodiments, such as that shown in FIG. 3A, the thermal compensation base layer 370 includes a metal inverse opal (MIO) structure 372, a cap layer 374 overgrown on the MIO structure 372, and a thermally conductive mount 376 disposed between the cap layer 374 and the heatsink 160. The MIO structure 372 and the cap layer 374 are substantially similar to the MIO structure 272 and the cap layer 274 described above. The thermally conductive mount 376 is made of copper, aluminum, nickel, and/or alloys thereof. A mold layer 395 is disposed between the heatsink 160 and the PCB 110 and configured to support the electronic assembly 300 and the thermal compensation base layer 370.

In the example embodiment shown in FIG. 3A, the heatsink 160, the heatsink manifold 165, the thermal compensation base layer 370, the cooling manifold 115, and the electrically insulated posts 180, 190 forming the fluid circuit 155 comprise the thermal management assembly 350, which operates substantially similar to the thermal management assembly 150 depicted by FIGS. 1A-1C. Heat is removed through the thermal compensation base layer 370 as well as a cooling fluid flowing through the heatsink manifold 165, the fluid circuit 155, and the cooling manifold 115, as described above. The thermal management assembly 350 is thermally connected to the PCB 110 and thus configured to remove heat from the electronic assembly 300 at high operating temperatures, for example in excess of 250° C.

Figure 4A:
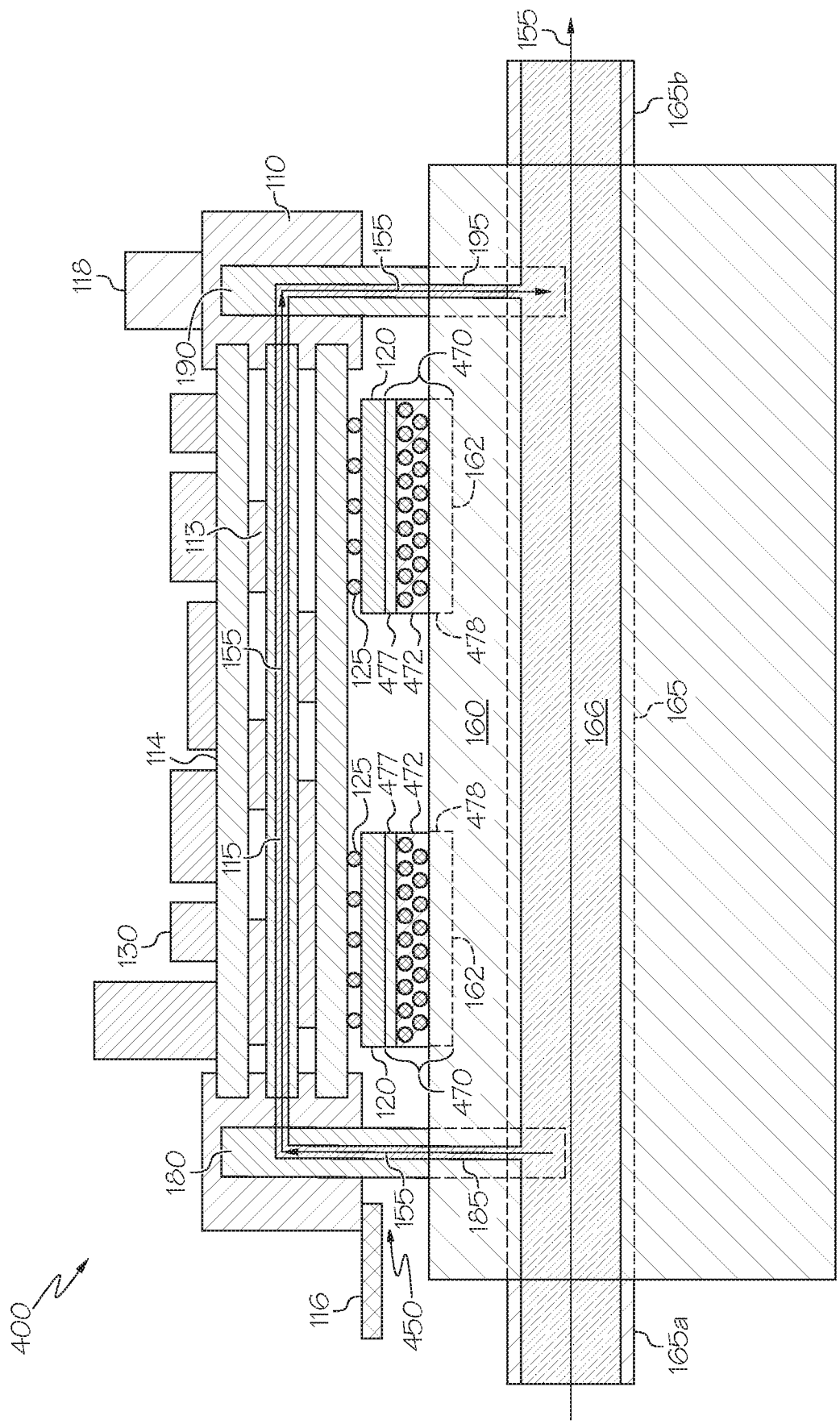
FIG. 4A depicts a lengthwise cross-sectional view of an electronic assembly integrated with a thermal management assembly with a heatsink that is configured with one or more slots to accommodate semiconductor devices, according to one or more embodiments shown and described herein.
Figure 4B:
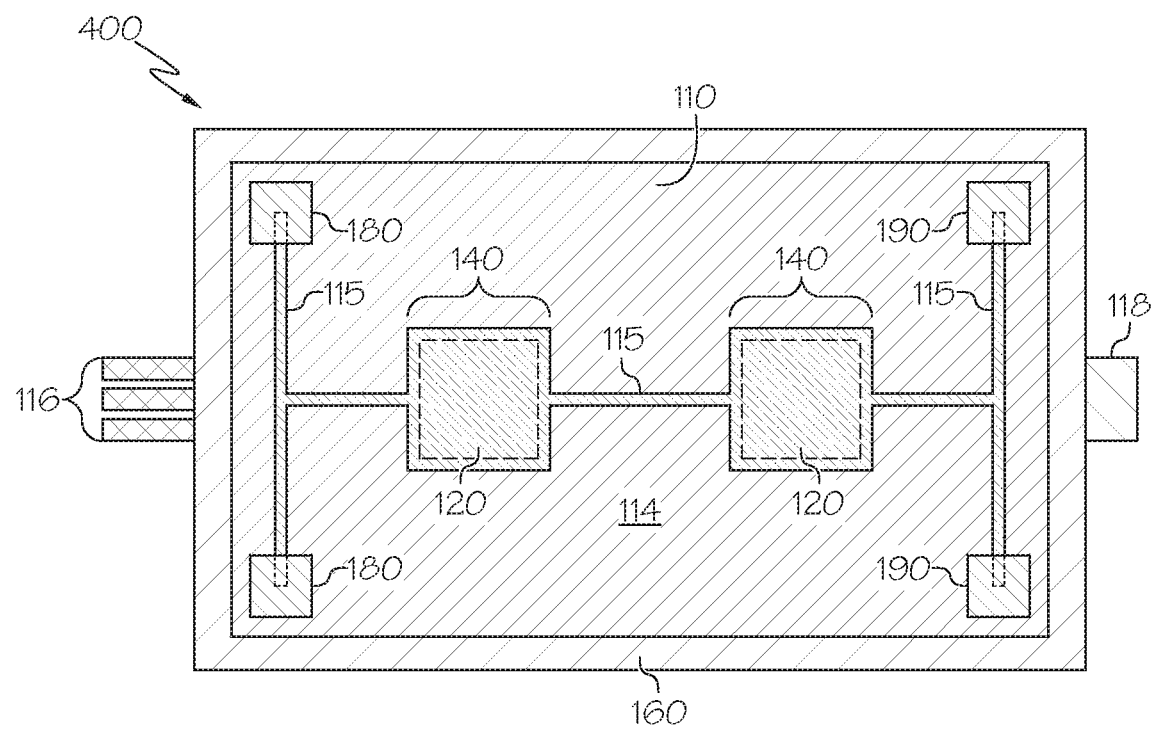
FIG. 4B depicts a top cross-sectional view of the electronic assembly of FIG. 4A, according to one or more embodiments shown and described herein.
Figure 4C:
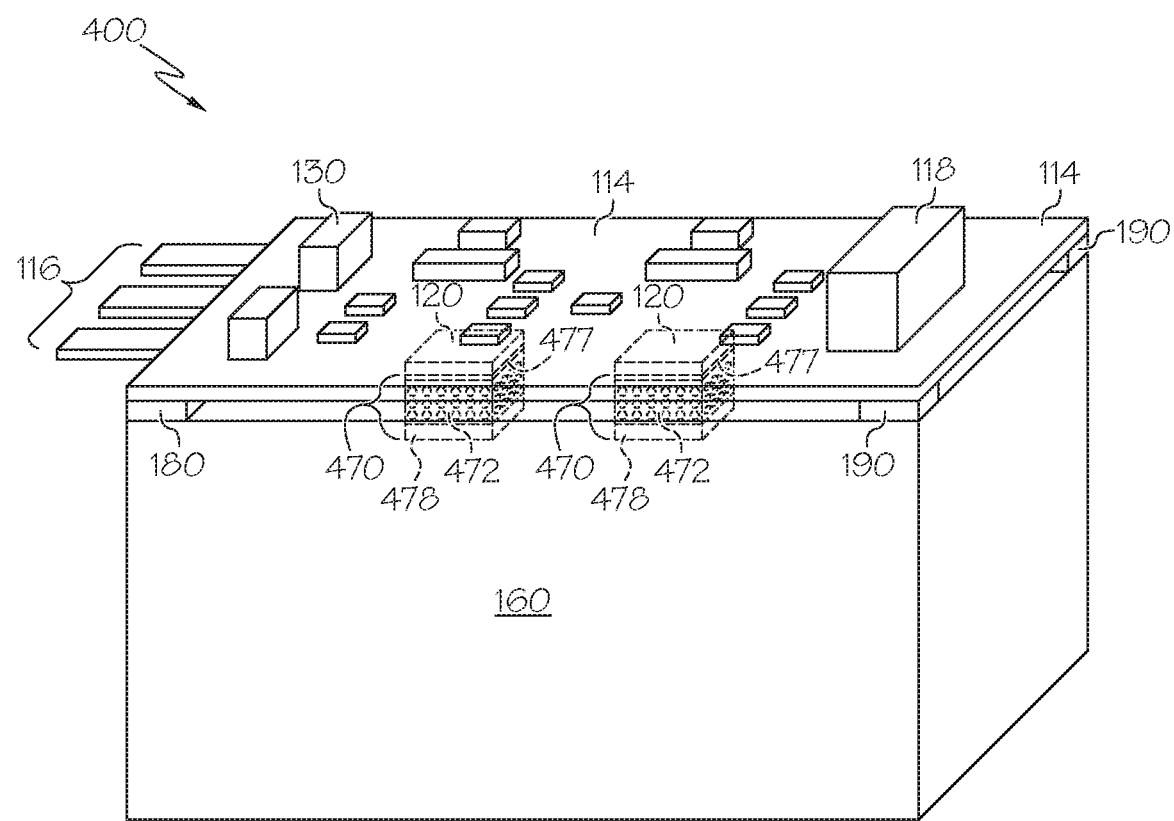
FIG. 4C depicts a perspective view of the electronic assembly of FIG. 4A, according to one or more embodiments shown and described herein.

FIG. 4A depicts a lengthwise cross-sectional view of another example electronic assembly 400 integrated with an example thermal management assembly 450. FIGS. 4B and 4C depict a top cross-sectional view and a perspective view of the example electronic assembly 400 shown in FIG. 4A.

The example electronic assembly 400 includes the multi-layered PCB 110 having the cooling manifold 115 disposed through the core layer 110b, as described above. The cooling manifold 115 is electrically isolated and configured to provide a targeted fluid flow path for absorbing heat from the electronic devices disposed on the PCB 110. One or more switching devices 120 and the power terminal 116 having positive and negative output are mounted on the bottom surface 112 of the PCB 110. One or more gate drive devices 130 are bonded to the top surface 114 of the PCB 110. The signal connector 118 is disposed on the top surface 114 of the PCB 110.

The switching devices 120 are thermally connected (for example, via mechanical connection) to a thermal compensation base layer 470, which is thermally coupled to the heatsink 160. Thus, the thermal compensation base layer 470 thermally connects the switching devices 120 to the heatsink 160. The heatsink 160 in the electronic assembly 400 includes a number of slots 162 to accommodate the thermal compensation base layer 470 coupled to each of the switching devices 120.

In some embodiments, such as that shown in FIG. 4A, the thermal compensation base layer 470 includes a metal inverse opal (MIO) structure 472, an electrical isolation layer 477 disposed between the MIO structure 472 and the switching devices 120 and a grease layer 478. The MIO structure 472 is substantially similar to the MIO structure 272 described above. The electrical isolation layer 477 may be made of a ceramic material such as, but not limited to, aluminum oxide. The grease layer 478 is applied between the MIO structure 472 and the surface of the slots 162 in the heatsink. The grease layer 478 may be a commonly known thermal interface material (TIM) used for enhanced thermal connection between the switching devices 120 and the heatsink 160.

In the example embodiment shown in FIG. 4A, the heatsink 160, the heatsink manifold 165, the thermal compensation base layer 470, the cooling manifold 115, and the electrically insulated posts 180, 190 forming the fluid circuit 155 comprise the thermal management assembly 450, which operates substantially similar to the thermal management assembly 150 depicted by FIGS. 1A-1C. Heat is removed through the thermal compensation base layer 470 as well as a cooling fluid flowing through the heatsink manifold 165, the fluid circuit 155, and the cooling manifold 115, as described above. The thermal management assembly 450 is thermally connected to the PCB 110 and thus configured to remove heat from the electronic assembly 400 at high operating temperatures, for example in excess of 250° C.

The thermal management assemblies described herein can be advantageously used as a thermal management solution for electronic assemblies having high heat flux applications. In vehicular applications, this enables the electronic assemblies to be maintained within a suitable operating temperature range. The structures of the electronic assemblies described herein also significantly reduces packaging size of electronic assemblies, especially the power electronic assemblies used as inverters in electric vehicles. Power electronic devices can be integrated with the gate drive devices used to control the operation of the power electronic devices into a single compact package without interfering with the signal interaction between the power electronic devices and the gate drive devices.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A thermal management assembly for cooling an electronic assembly disposed on a printed circuit board, the thermal management assembly comprising:
a heatsink;
a heatsink manifold formed through the heatsink, the heatsink manifold having a fluid inlet and a fluid outlet;

a thermal compensation base layer coupled to the heatsink and configured to thermally connect the heatsink and the electronic assembly;
a cooling manifold configured to be disposed through the printed circuit board to form a fluid flow path through the printed circuit board; and
two or more electrically insulated posts disposed between the heatsink manifold and the cooling manifold and having a vertical cooling channel through individual electrically insulated posts, wherein at least one electrically insulated post fluidly connects the fluid inlet to the cooling manifold to form an upward fluid path and at least one electrically insulated post fluidly connects the cooling manifold to the fluid outlet to form a downward fluid path.

2. The thermal management assembly of claim 1, wherein the one or more electrically insulated posts comprise poly-silicon or a ceramic material.

3. The thermal management assembly of claim 1, wherein the heatsink is a cold plate.

4. The thermal management assembly of claim 1, wherein the thermal compensation base layer is formed from one or more of the following: copper, aluminum, nickel, and alloys thereof.

5. The thermal management assembly of claim 1, wherein the thermal compensation base layer comprises:
a metal inverse opal (MIO) structure;
a cap layer overgrown on the MIO structure; and
an electrically insulating layer disposed between the cap layer and the heatsink, the electrically insulating layer comprising a metal oxide.

6. The thermal management assembly of claim 1, wherein the thermal compensation base layer comprises:
a metal inverse opal (MIO) structure; and
a thermally conductive mount disposed between the MIO structure and the heatsink.

7. The thermal management assembly of claim 1, wherein the thermal compensation base layer comprises:
a metal inverse opal (MIO) structure; and
an electrical isolation layer disposed between the MIO structure and the one or more switching semiconductor devices.

8. An electronic assembly comprising:
a printed circuit board having a first surface and a second surface opposite to the first surface;
one or more switching semiconductor devices disposed on the first surface;
one or more gate drive devices disposed on the second surface; and
a thermal management assembly thermally connected to the printed circuit board, the thermal management assembly comprising:
a heatsink;
a heatsink manifold formed through the heatsink, the heatsink manifold having a fluid inlet and a fluid outlet;
a thermal compensation base layer coupled to the heatsink and configured to thermally connect the heatsink and the one or more switching semiconductor devices;
a cooling manifold disposed through the printed circuit board to form a fluid flow path through the printed circuit board; and
two or more electrically insulated posts disposed between the heatsink manifold and the cooling manifold and having a vertical cooling channel through individual electrically insulated posts, wherein at least one electrically insulated post fluidly connects the fluid inlet to the cooling manifold to form an upward fluid path and at least one electrically insulated post fluidly connects the cooling manifold to the fluid outlet to form a downward fluid path.

9. The electronic assembly of claim 8, wherein the one or more switching semiconductor devices are formed from one or more of the following: silicon carbide (SiC), silicon dioxide ($SiO_2$), aluminum nitride (AlN), gallium nitride (GaN), and boron nitride (BN).

10. The electronic assembly of claim 8, wherein the one or more gate drive devices are operable to control the one or more switching semiconductor devices.

11. The electronic assembly of claim 8, wherein:
the printed circuit board comprises a first ceramic layer, a second ceramic layer and a third ceramic layer stacked vertically; and
each electrically insulated post extends through the first ceramic layer, the second ceramic layer and the third ceramic layer.

12. The electronic assembly of claim 8, wherein the cooling manifold comprises one or more heat transfer chambers configured to receive heat generated by the one or more switching semiconductor devices.

13. The electronic assembly of claim 8, wherein the one or more electrically insulated posts comprise poly-silicon or a ceramic material.

14. The electronic assembly of claim 8, wherein the heatsink is a cold plate.

15. The electronic assembly of claim 8 further comprising:
a mold layer disposed between the heatsink and the printed circuit board and configured to support the electronic assembly and the thermal compensation base layer.

16. The electronic assembly of claim 8, wherein the thermal compensation base layer is formed from one or more of the following: copper, aluminum, nickel, and alloys thereof.

17. The electronic assembly of claim 8, wherein the thermal compensation base layer comprises:
a metal inverse opal (MIO) structure;
a cap layer overgrown on the MIO structure; and
an electrically insulating layer disposed between the cap layer and the heatsink, the electrically insulating layer comprising a metal oxide.

18. The electronic assembly of claim 8, wherein the thermal compensation base layer comprises:
a metal inverse opal (MIO) structure; and
a thermally conductive mount disposed between the MIO structure and the heatsink.

19. The electronic assembly of claim 8, wherein the thermal compensation base layer comprises:
a metal inverse opal (MIO) structure; and
an electrical isolation layer disposed between the MIO structure and the one or more switching semiconductor devices.

20. The electronic assembly of claim 8, wherein a surface of the heatsink is configured with one or more slots to accommodate the thermal compensation base layer coupled to each of the one or more switching semiconductor devices.

* * * * *